(12) United States Patent
Basell et al.

(10) Patent No.: US 11,933,832 B2
(45) Date of Patent: Mar. 19, 2024

(54) CONDUCTOR TEST EQUIPMENT (71) Applicant: Teletech Pty Ltd, Victoria (AU)

(72) Inventors: Malcolm Charles Basell, Victoria (AU); Sean Anthony Gallagher, Victoria (AU)

(73) Assignee: Teletech Pty Ltd, Victoria (AU)

( * ) Notice: Subject to any disclaimer, the term of this patent is extended or adjusted under 35 U.S.C. 154(b) by 565 days.

(21) Appl. No.: 17/252,621

(22) PCT Filed: Jul. 11, 2019

(86) PCT No.: PCT/AU2019/050729
§ 371 (c)(1),
(2) Date: Dec. 15, 2020

(87) PCT Pub. No.: WO2020/010402
PCT Pub. Date: Jan. 16, 2020

(65) Prior Publication Data
US 2021/0255229 A1 Aug. 19, 2021

(30) Foreign Application Priority Data
Jul. 11, 2018 (AU) .............................. 2018902517

(51) Int. Cl.
*G01R 31/08* (2020.01)
*A01D 34/00* (2006.01)
*A01D 101/00* (2006.01)

(52) U.S. Cl.
CPC ......... *G01R 31/083* (2013.01); *A01D 34/008* (2013.01); *A01D 2101/00* (2013.01)

(58) Field of Classification Search
CPC . G01R 31/083; A01D 34/008; A01D 2101/00
See application file for complete search history.

(56) References Cited

U.S. PATENT DOCUMENTS 3,882,287 A * 5/1975 Simmonds ............. G01R 31/60
379/22.03
5,714,885 A 2/1998 Lulham
(Continued)

FOREIGN PATENT DOCUMENTS

GB 2279761 A 1/1995
JP S5426483 A 2/1979
(Continued)

OTHER PUBLICATIONS

Extended Search Report from counterpart European Application No. 19834406.1 dated Mar. 14, 2022, 12 pp.
(Continued)

*Primary Examiner* — Jermele M Hollington
*Assistant Examiner* — Taqi R Nasir
(74) *Attorney, Agent, or Firm* — Shumaker & Sieffert, P.A.

(57) ABSTRACT

The invention provides a system for locating a fault in a conductor such, as a break in a buried wire. The system includes a first conductor portion and a second conductor portion separated from each other by the fault, the system including a field generator, having: a first connection connectable to the first conductor portion, a first signal generator configured to apply a first oscillating signal between the first connection and an earth, the first oscillating signal having a frequency of between 1 and 20 kHz, and a mobile detector for detecting an electric field produced by the application of the first oscillating signal to the first conductor portion, the detector including a capacitive sensor element, a signal processor to which the sensor element is connected and having an output, and a monitor receiving the output from the signal processor and providing a signal to an operator to indicate the position of the fault.

14 Claims, 3 Drawing Sheets

(56) References Cited

U.S. PATENT DOCUMENTS

| | | |
|---|---|---|
| 6,215,314 B1 | 4/2001 | Frankewich, Jr. |
| 8,269,504 B2 | 9/2012 | Gerig |
| 9,072,219 B2 | 7/2015 | Da Rocha et al. |
| 9,079,303 B2 | 7/2015 | Abramson et al. |
| 9,471,063 B2 | 10/2016 | Ouyang |
| 2007/0279067 A1 | 12/2007 | Wiswell et al. |
| 2015/0356855 A1* | 12/2015 | Kalokitis ........... G01R 19/0007 340/658 |

FOREIGN PATENT DOCUMENTS

| | | | |
|---|---|---|---|
| RU | 2587533 C1 * | 6/2016 | ............. G01R 31/08 |
| RU | 2587533 C1 | 6/2016 | |

OTHER PUBLICATIONS

International Search Report and the Written Opinion for International Application No. PCT/AU2019/050729, dated Sep. 4, 2019, 10 pgs.

International Preliminary Report on Patentability for International Application No. PCT/AU2019/050729, dated Nov. 6, 2020, with Response to Written Opinion, 17 pgs.

International Search Report for corresponding AU Application No. 2018902517, dated Jul. 3, 2019, 20 pages.

\* cited by examiner

CONDUCTOR TEST EQUIPMENT

This application is a national stage application under 35 U.S.C. § 371 of PCT Application No. PCT/AU2019/050729, filed Jul. 11, 2019, which claims the benefit of AU Application No. 2018902517, filed Jul. 11, 2018. The entire contents of each of PCT Application No. PCT/AU2019/050729 and AU Application No. 2018902517 are incorporated herein by reference in their entirety.

FIELD OF THE INVENTION

The invention concerns conductor test equipment, and in particular it relates to a system and method for locating a fault in a conductor composed of a first conductor portion and a second conductor portion separated from each other by the fault. The invention has particular but not limited application to locating breaks in a robotic lawn mower containment system in which the conductor comprises a single boundary wire.

BACKGROUND OF THE INVENTION

Wire loop antenna containment systems are known, for example to assist in containing animals in a particular area. A wire loop is laid around a designated area and electrically connected with a transmitter configured to produce a designated signal, and each animal is fitted with a receiver. The receiver is responsive to the designed signal and when an animal approaches the wire the receiver detects the signal and delivers an alert and/or a stimulus to the animal.

If the antenna wire is damaged, the animal containment system ceases to function, and it is necessary to locate the damaged section and repair the break or fault. However, it can be difficult to locate the damaged section, particularly if the wire is buried or hidden, eg under grass.

Methods have been proposed in the past to address this problem, including U.S. Pat. No. 6,215,314 entitled 'Wire break locator and method of use'.

Over recent years, robotic lawn mower systems have been developed (such as the Husqvarna Automower® system), and are rapidly gaining acceptance. These systems operate in a similar way to robotic vacuum cleaners, with a battery charging station to which the robotic lawn mower returns whenever its charge is depleted. However, unlike a robotic vacuum cleaner, there are no walls to contain the lawn mower. A wire loop containment system can therefore be employed. For this purpose, a wire is placed around the operating perimeter (eg. around the lawn boundary) and connected at each end to a signal generator unit integrated into the battery charging station, which is generally positioned near the boundary. The signal generator unit passes a suitable low power oscillating electric current (for example, at a frequency of 8 kHz) through the wire to produce a magnetic field, and the lawn mower is equipped with a receiver designed to detect this magnetic field. When the receiver detects that it is in the vicinity of the wire it sends a signal to the lawn mower control system to instruct the lawn mower to reverse or change direction, hence the mower only operates within the confines of the wire loop. The robotic lawn mower cuts the grass by moving in a pseudo-random pattern around the lawn. If it encounters an object (such as a wall or tree) it reverses direction and then heads in a new random direction. Over time the whole lawn is mowed.

If the wire is damaged (cut, broken or partially broken) the magnetic field is reduced or ceases and the boundary guide function fails. The lawn mower control system is configured to prevent the mower from operating until the fault has been remedied, operation prevention triggered by detection of the open circuit or high resistance resulting from the fault.

The perimeter wire can be placed on the surface of the lawn, or more usually is buried up to about 100 mm below the surface. Even when the wire is not buried, over time it tends to become covered with grass and sinks below the surface. It is not uncommon for the wire to be cut or otherwise damaged by digging or other gardening or landscaping activities, or it can degrade through corrosion of a part of the wire or a wire connection. Particularly in colder climates where freezing temperatures occur seasonal temperature changes can lead to movement of the upper ground layers and resulting damage.

Finding breaks in a wire is not always a simple task, as the point of discontinuity is rarely obvious. Typically, the wire used in such systems is an insulated, unshielded stranded wire of suitable gauge, with an appropriate length dependent on the size and topology of the area to be mowed, but potentially up to 1000 metres or more for large gardens or gardens of complex shape. Accordingly, it is almost impossible to find the location of a break without digging up the entire wire, which can be an extremely time consuming and inconvenient exercise. Further, digging to visually inspect the wire to locate a break can significantly increase the risk of further damage to the wire.

Previously, electricity power cable sheath fault locators have been proposed for use in detecting such wire faults. These are designed to detect leakage faults when there is a breakdown in the insulation between a conductor and ground. Such instruments are generally undesirably sensitive for the required application, detecting numerous false positives. These instruments are also very expensive pieces of equipment, whose use would seldom be cost effective in this area of application.

Other techniques that have been considered use an RF signal transmitted through the wire, the wire acting as an antenna to transmit the RF signal. This can then be monitored by way of a conventional portable radio tuned to the correct frequency, and the approximate location of buried wire can thus be found. However, such techniques have not been found to afford a usefully accurate determination of the location of a break in the wire. As an example, and as mentioned above, U.S. Pat. No. 6,215,314 discloses a wire break identification method for application to a pet containment system. The method employs first and second different, continuous AM frequencies to a common carrier frequency, applied to each end of a broken wire, an AM radio locator tuned to that carrier frequency used to produce an audible tone (at the first frequency) that attenuates towards the break, then changes (to the second frequency), allowing a user to find the break by scanning with the locator. The AM signals are applied at 460 Hz and 2 KHz on a 530 kHz RF carrier wave.

Reference to any prior art in the specification is not an acknowledgment or suggestion that this prior art forms part of the common general knowledge in any jurisdiction or that this prior art could reasonably be expected to be combined with any other piece of prior art by a person skilled in the art.

SUMMARY OF THE INVENTION

In a first broad form, the present invention provides a system for locating a fault in a conductor composed of a first conductor portion and a second conductor portion separated from each other by the fault, the system including a field generator, having a first connection connectable to the first conductor portion, a first signal generator configured to apply a first oscillating signal between the first connection and an earth, the first oscillating signal having a frequency of between 1 and 20 kHz, and a mobile detector for detecting an electric field produced by the application of the first oscillating signal to the first conductor portion, the detector including a capacitive sensor element, a signal processor to which the sensor element is connected and having an output, and a monitor receiving the output from the signal processor and providing a signal to an operator to indicate the position of the fault.

The mobile detector may therefore be manoeuvred to and along said first conductor portion using the output signal as feedback to guide the movement, the output signal then providing an indication of the location of the fault as the mobile detector nears its position.

The capacitive nature of the detector sensor, with the wire conductor in effect providing one 'plate' of the capacitor, provides a sensing ability significantly more localised than contemplated in the prior art, in which the sensing function relied on magnetic field coupling between an RF transmitter and RF aerial.

In a preferred form, the field generator includes a second connection connectable to the second conductor portion and a second signal generator configured to apply a second oscillating signal between the second conductor portion and an earth, the second oscillating signal having a frequency of between 1 and 20 kHz and being different to the first oscillating signal, the detector configured to detect an electric field produced by the application of the second oscillating signal to the second conductor portion.

The first and second signal generators may be combined in a single integrated signal generator.

It will be appreciated that this embodiment involves the use of two distinct signals for detection, as opposed to prior art methods such as that discussed above employing an RF system and including the use of different modulations applied to a single carrier signal. The use of different signals (eg. two signals at different frequencies) for the signal generation can aid significantly in detection.

It will be appreciated that the first and second oscillating signals may be equal but opposite signals, or in a preferred form the signals are oscillations at different frequencies.

In one embodiment, the output from the signal processor provides a comparison to the operator between the electric field produced by the application of the first oscillating signal to the first conductor portion and the electric field produced from the application of the second oscillating signal to the second conductor portion.

Preferably, the detector includes a further capacitive sensor element, the two capacitive sensor elements being configured to detect, respectively, the electric fields produced by the application of the first and the second oscillating signals to the respective conductor portions.

In one form, the oscillating signals applied to the first and the second connections are pseudorandom signals, and the signal processor includes an A/D converter and an analysis module able to discriminate between the two resulting electric fields.

The pseudorandom signals may be binary sequences, such as MLS sequences. Opposite binary sequences may be applied to each conductor portion to provide an abrupt discontinuity on a detected impulse response as the sensor element approaches and passes the fault.

Preferably, the earth is a ground (such as a temporary ground stake) as distinct from a non-grounded return.

In a preferred form, the monitor includes a visual output and an audio output to the operator to assist in following one or both conductor portions and in locating the position of the fault.

In broad terms, then, the present invention provides equipment to detect a broken or damaged boundary wire, so that the location of the damaged part of the wire can be quickly detected and thus repaired. When the detector sensor is brought into a position near a wire to which the oscillating signal is applied, it detects the resulting electric field, processes the resulting signal, and provides this to the operator, preferably as a combination of an audible tone and on a visual display. The signal changes as the detector approaches the fault, allowing the operator to determine the location of the fault with a relatively high degree of accuracy, so reducing the effort (in particular, unnecessary digging) required to locate the fault.

The system therefore includes a probe, having a capacitive sensor for locating the faults in the boundary wire, and an oscillator configured to apply a signal to the wire to enable the probe to locate the wire. The probe is held close to the ground and capacitively couples to the wire, electrically connecting to an amplifier and to a speaker and/or a visual indicator.

The capacitive sensor element preferably comprises a capacitor plate, which may for example be formed as a metallic plate on a layer of a printed circuit board. The capacitor plate is preferably shielded to sense electric fields emanating primarily from one side of the plate only (ie. in use, from the downward direction).

The detector may include a second, reference capacitive sensor element (such as a similar metallic plate). This enables differencing of the sensed voltages of the two elements in order to reduce instrument sensitivity to fields outside the immediate vicinity of the sensor. The second, reference capacitive sensor element may be shielded in a similar way to the capacitive sensor element, and may be arranged to sense electric fields emanating from a different direction.

In particular, the capacitive sensor element and the second, reference capacitive sensor element may be provided in the detector in a stacked, reversed arrangement to respectively detect fields coming from mutually opposed directions (ie. in use, from above and below).

For a robotic lawn mower system with a charging station, the oscillator is connected to the boundary wire at the charging station and generates a signal detectable by the sensor. Preferably, the probe is battery operated, lightweight and portable so it can be transported and used by one person.

In a further broad form, the invention provides a method for locating a fault in a conductor composed of a first conductor portion and a second conductor portion separated from each other by the fault, the method including using a field generator to apply a first oscillating signal between the first conductor portion and an earth, the first oscillating signal having a frequency of between 1 and 20 kHz, using a mobile detector to capacitively detect a first electric field produced by the application of the first oscillating signal and generate a signal representing the detected first electric field, and maneuvering the mobile detector to locate the position of the fault by reference to the generated signal.

Preferably, the method includes using the field generator to apply a second oscillating signal between the second conductor portion and an earth, the second oscillating signal having a frequency of between 1 and 20 kHz and being different to the first oscillating signal, using the mobile detector to capacitively detect a second electric field produced by the application of the second oscillating signal and generate a signal representing the detected second electric field, and maneuvering the mobile detector to locate the position of the fault by reference to the signals generated by detection of both first and second electric fields.

Preferably, the earth is a ground (such as a temporary ground stake) as distinct from a non-grounded return.

BRIEF DESCRIPTION OF THE DRAWINGS

Further aspects of the present invention and further embodiments of the aspects described in the preceding paragraphs will become apparent from the following description, given by way of example and with reference to the accompanying drawings.

DETAILED DESCRIPTION OF THE EMBODIMENTS

It will be understood that the invention disclosed and defined in this specification extends to all alternative combinations of two or more of the individual features mentioned or evident from the text or drawings. All of these different combinations constitute various alternative aspects of the invention.

Figure 1:
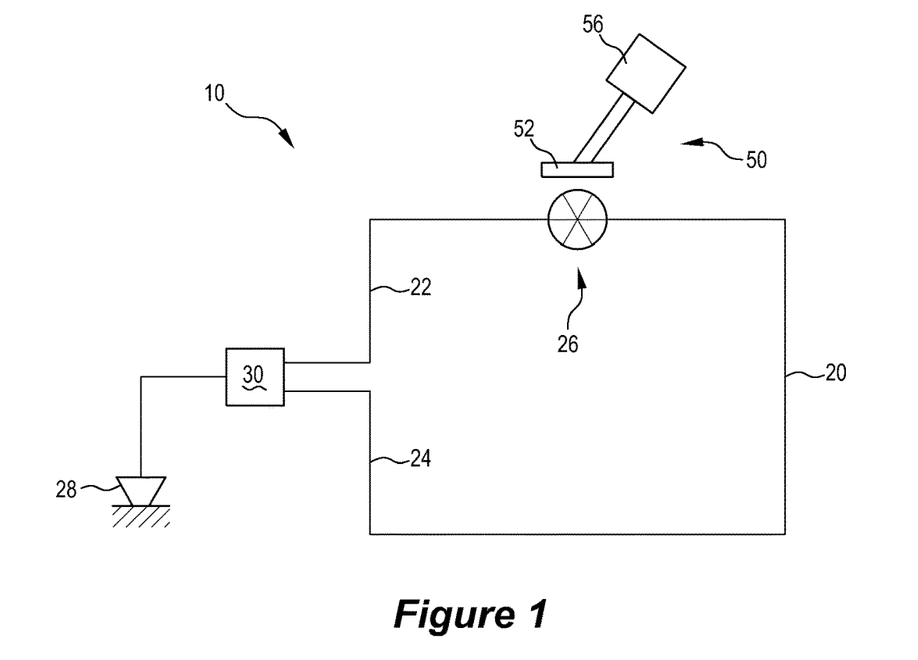
FIG. 1 schematically illustrates a conductor fault location system in accordance with the invention.

The conductor fault location system 10, for use with a robotic lawn mower system, is illustrated in FIG. 1. It includes a field generator 30 with electrical connections to buried wire 20, having first end 22 and second end 24. Wire 20 has a fault 26 (a break or partial break (causing an open circuit or a high resistance) at a location to be determined.

The system further includes detector 50 to be manoeuvred by an operator, detector 50 comprising a capacitive sensor 52 at a distal end and a monitor unit 56 at a proximal end, monitor unit 56 providing output to the operator as discussed further below.

Field Generator

Figure 2:
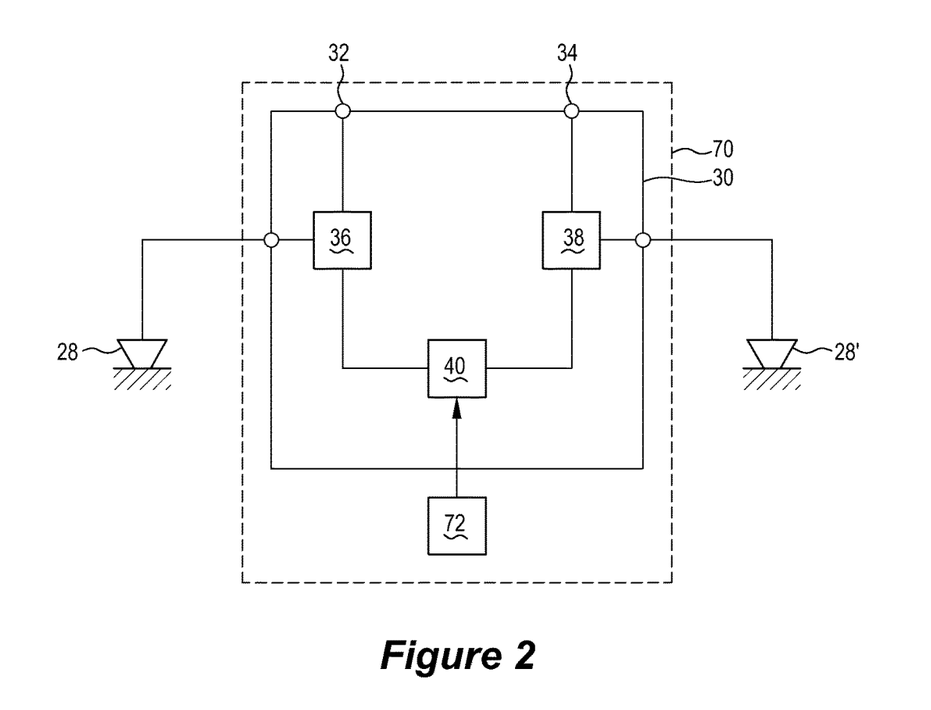
FIG. 2 schematically illustrates a field generator of the conductor fault location system of FIG. 1.

Field generator 30 is illustrated in more detail in FIG. 2, and includes a first and second electrical connection 32, 34 for connection to first and second end 22, 24 of wire 20. Field generator 30 further includes first and second signal generators 36 and 38, connected respectively to electrical connections 32, 34. Signal generators 36 and 38 are controlled by field generator controller 40. It will be appreciated that the two signal generators may be provided as separate units, or may be parts of a single unit arranged to provide two separate output signals.

The electrical signals are applied by signal generators 36, 38 between the output electrical connection (respectively connections 32, 34) and an earth, provided by a connection to a ground stake (respectively, ground stakes 28 and 28'), driven securely into the ground. Ideally, the earth where the ground stake is applied should be wet, if necessary by application of water in the surrounding area.

In this way, when connected to wire 20 by way of connections 32 and 34, separate different signals may be applied to wire ends 22 and 24. With a suitable signal, each wire portion (between fault 26 and, respectively, end 22 and end 24) will therefore produce an electric field that radiates from the wire, the extent of its field depending on the signal strength applied. The field generator applies a voltage between the earth and the wire, thus generating an electric field with respect to ground. This allows the capacitor plate 53 (see below) to couple to the wire capacitively to detect the electrical signal with respect to ground.

Signal generators 36, 38 generate low frequency signals (at a frequency of between 1 and 20 kHz) with an output impedance of around 600 ohms and amplitude of 10 Vpp. The skilled reader will appreciate that at such low frequencies the wire portions act as electric field generators rather than as transmitters.

As the skilled reader will understand, the signal applied to one wire end 22 or 24 of wire 20 may be the inverse of the signal applied to the other wire end 24 or 22. Alternatively, as discussed further below, signals at different frequencies may be applied to the respective wire ends 22, 24.

In an alternative approach, the invention may be realised with the application of a signal to only one end 22 or 24 of the wire 20, meaning that transmitter 30 requires only one signal generator. Again, the signal is applied between the appropriate connection 32 or 34 and an earth stake 28 or 28'.

Field generator 30 is incorporated into robotic lawn mower system charging station 70. Power (along with, optionally, control signals) is provided by a power/control module of charging station 70. In an alternative embodiment, field generator 30 may be a separate portable battery powered unit.

Detector

Figure 3:
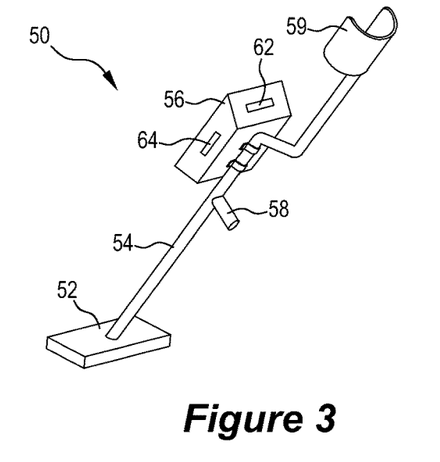
FIG. 3 shows a detector of the conductor fault location system of FIG. 1.

As FIG. 3 shows, detector 50 is a portable device comprising a capacitive sensor 52, a longitudinal shaft 54 and a monitor unit 56, shaft 54 terminating at a stabiliser portion 59 to assist maneuvering by an operator. As shown, sensor 52 is mounted at the distal end of shaft 54 and monitor unit 56 is attached towards the shaft proximal end, ie. proximate to the operator. The shaft may also include a handle 57, again to assist maneuvering by the operator.

Figure 4:
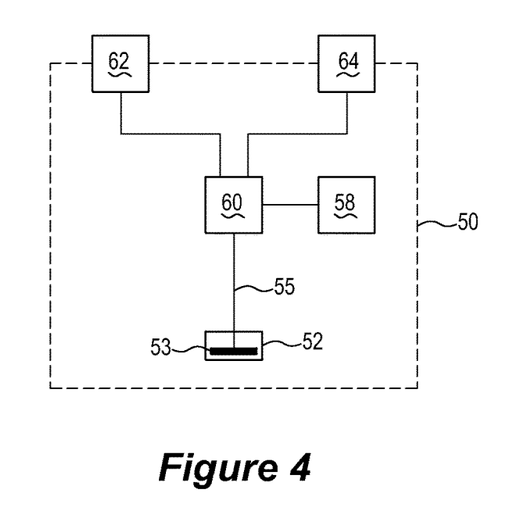
FIG. 4 schematically illustrates the components of the detector of FIG. 3.

More specifically, as shown in FIG. 4, sensor 52 includes a capacitor plate 53, provided as a copper area on a PCB 84 (see FIG. 6A), and a buffer amplifier to convert high impedance capacitive inputs to low impedance outputs. The output then passes via shaft connection bus 55 to a signal processing unit (SPU) 60 contained within monitor unit 56. SPU 60 includes a second stage amplifier and mixer, configured to shift the frequency of the signal and then amplify it. A power supply 58, such as a rechargeable battery unit, powers the components of the detector. SPU provides output signals to a visual operator interface 62 and an audio operator interface 64, discussed further below. An audio operator interface 64 is provided for connection of an operator headphone or earphone (not shown).

In operation, the operator manoeuvres detector 50 along a wire portion from first or second end 22, 24 of wire 20, keeping sensor 52 close to the ground, with the underside of capacitor plate 53 directed downwardly. Capacitive coupling between the wire and capacitor plate 53 provides an electrical signal that is passed to and processed by SPU 60 to provide an output to the visual and audio interfaces 62 and 64 monitored by the operator. Visual interface 62 provides to the operator a visual indication of the amplitude of the detected signal, while audio interface 64 provides to the operator an audio signal with a volume proportional to the amplitude. The operator therefore uses the output as a feedback system, moving detector 50 to maximise the received signal and thus following the buried wire along its course.

As sensor 52 approaches fault 26 a second signal emanating from the second wire portion is detected by sensor 52 and gradually increases as it moves closer to the fault. Moving along the wire both signals will be detected, and as sensor 52 moves beyond fault 26 the first signal will begin to decrease. Hence, to locate the fault, the operator manoeuvres sensor 52 until the output signals are of equal amplitude, thus determining the location with precision.

As noted above, the electric field generated by the electrical signal applied with respect to ground couples capacitively to plate 53. The capacitive coupling is proportional to the distance from the wire, and therefore as sensor 52 moves away from wire 20 the signal attenuates proportionally. Detection of the wire is therefore significantly more localised than possible using an RF signal, where the wire acts as an antenna.

In this embodiment, the use of both a visual and an audio interface is found to be highly advantageous. The visual interface allows the operator to view two displayed signal amplitudes together on a monitor screen, providing a clear visual prompt when the amplitudes are equal. Alternatively or in addition, this may be automatically determined, with an output such as a light providing an indication when the signal amplitudes are matched. The audio interface means that the operator is not required to constantly observe the monitor, which could otherwise be tiring or dangerous as the operator navigates along the wire. Instead, the operator may monitor solely the audio signal as she moves along a wire portion, switching her attention to the visual interface as the second signal is detected for the finer determination afforded by the visual output.

Figure 5:
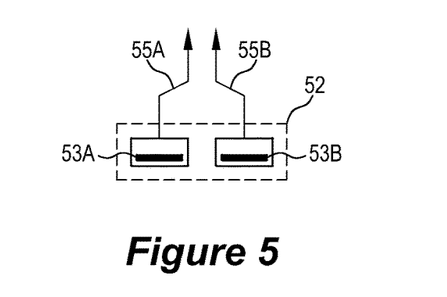
FIG. 5 schematically illustrates an alternative form of the sensor component of FIG. 4.

In a modified form of detector 50, illustrated in FIG. 5, sensor 52 includes two separate capacitive plates 53A and 53B arranged side by side, each connecting separately with SPU 60 via shaft connection buses 55A and 55B, respectively. By way of suitable signal processing this arrangement can provide a clearer distinction between signals detected from the two different wire portions as fault 26 is approached and traversed.

In a further embodiment (not illustrated), sensor 52 of detector 50 may include multiple capacitive plates suitably configured and connected to SPU 60 to provide full 2-dimensional guidance feedback to the operator. In this form, using suitable signal processing in SPU 60 and an appropriate visual interface 64, such an arrangement can be used to provide to the operator an indication of the direction to move detector 50 in order to trace wire 20 and then to localise fault 26. For example, the visual interface may comprise FORWARD/BACKWARD/LEFT/RIGHT arrows, as a guide to the operator. In this embodiment, the visual interface can be provided on the distal portion of detector 50, making it easier for the operator to move sensor 52 to follow the guidance prompts.

Signal Processing Unit

As noted above, SPU 60 includes a second stage amplifier and mixer, which shifts the frequency of the signal before amplifying it. As will be understood, the frequency shift assists in keeping the amplifier stable when there is a large amplifier gain.

Alternatively, SPU 60 can comprise a digital signal processor block, preferably having architecture optimised to execute the digital signal processing algorithms required for this application (rather than a suitable programmed general purpose microprocessor programmed). In this embodiment the detector includes an AD converter for the signal detected by sensor 52, and one or more DA converters to provide output signals to visual and audio operator interfaces 62 and 64.

Whether using an analogue or digital SPU 60, in one embodiment the system can be used to generate and detect two different signals applied respectively to the two wire portions separated by fault 26. The signals are selected to be readily distinguished from each other by SPU 60 and may be, for example, regular oscillations of different frequency, of the same frequency but opposite forms, or different waveforms, or any suitable combination.

In a further embodiment, the generated signals may be different pseudorandom sequences, applied as low pass filtered binary signals to the two wire portions. Suitable pseudorandom sequences lend themselves to computationally efficient discrimination when detected by sensor 52 and analysed by SPU 60. Examples of suitable signal sequences are MLS (maximum length sequence), used for measuring impulse responses and in spread spectrum telecommunications systems. A discussion of such pseudorandom binary sequences and the theory around extraction of the impulse response therefrom can be found at http://www.commsp.ee.ic.ac.uk/~mrt102/projects/mls/MLS%20Theory.pdf. As the skilled reader will appreciate, the Walsh-Hadamard transform is a suitable computationally efficient method of obtaining the impulse response. The amplitude of the impulse response can thus be used to detect the signal from the wire (and so to assist in locating the fault).

Alternatively, if a common pseudorandom series is applied to both wire portions, with the signal on one portion being the inverse of that applied to the other portion the response signal reverses at the fault, enabling ready detection of the location of the fault. That is, the impulse response changes from positive to negative as the detector moves past the fault. This abrupt change in polarity can be used to accurately locate the fault.

As will be understood, a key feature of the present invention is the capacitive nature of the detector sensor, with the wire conductor effectively providing one plate of a capacitor (the other plate comprised in the sensor). The capacitive coupling between the wire and plate is inherently significantly more localised than the magnetic field coupling between an RF transmitter and antenna (such as between the wire and AM pickup coil of U.S. Pat. No. 6,215,314). It is therefore necessary that a low frequency electrical signal is employed (between the respective wire portion and an effective earth), and the applicant has determined that the range 1 KHz-20 KHz is suited to this technique. At low frequencies there is significantly lower signal attenuation in applications of this nature.

In an alternative embodiment, sensor 52 includes, in addition to a first capacitor plate 53, a second identical reference capacitor plate 53', stacked on top of and facing away from plate 53. Reference plate 53' allows for determination of the voltage difference between the two plates, effectively creating a dipole sensor. As the plates are in close proximity, the difference between them can be used to effectively reduce sensitivity to electric fields that are outside the immediate vicinity of the sensor. As will be understood, the instrument common voltage (against which the voltage detected by plate 53 is measured) can otherwise be influenced by any local electric fields.

The differencing of the voltages detected by the two capacitor plates may be performed in the analog or digital domain. As the electric field caused by the applied signal is radial to wire 20, stacking the two capacitor plates enables a more accurate differential detection of the localised electric field. However, as will be appreciated, other arrangements may also be used, such as arranging reference plate 53' tangential to plate 53.

Figure 6A:
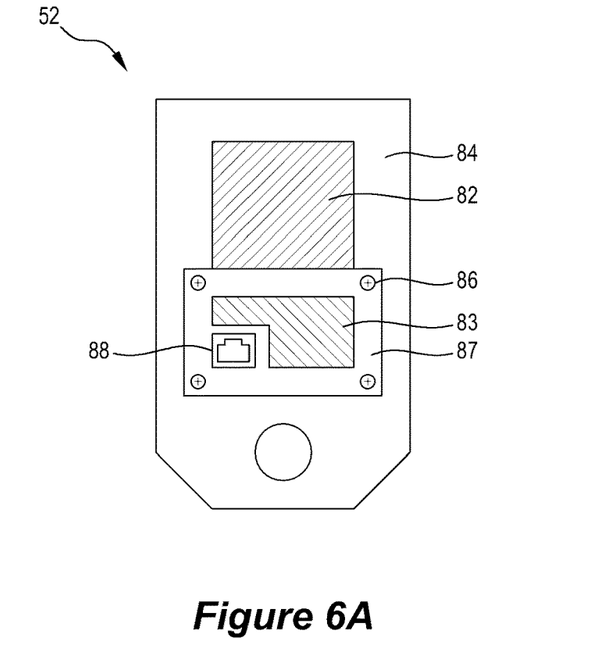
FIGS. 6A and 6B show two alternative forms of the capacitor plate arrangements of the sensor component of FIG. 4.
Figure 6B:
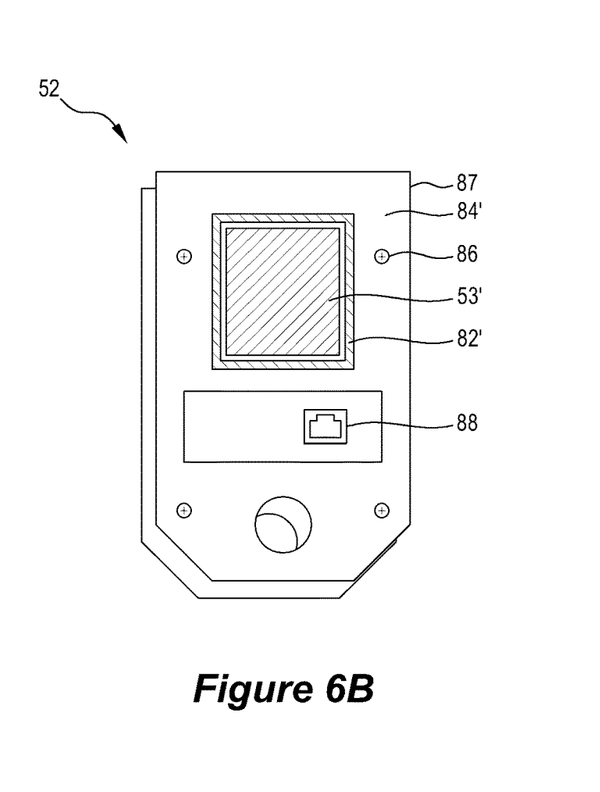

FIGS. 6A and 6B show two example embodiments of the internal components of sensor 52, both shown from the upper side. The sensor of FIG. 6A includes a single capacitor plate 53 on PCB 84 (plate 53 not shown as it is on the underside of PCB 84). A processor board 87 is mounted to PCB 84 with fastening screws 86, and houses processor components 83. Processor output 88 enables electrical connection between the sensor 52 and the monitor unit 56. A driven guard in the form of a rectangular guard plate 82 on the upper side of PCB 84 (ie. on the opposite side to plate 53) as well as a ring trace surrounding plate 53. The driven field guard provides a shield for the capacitor plate, as discussed further with regard to FIG. 6B.

In the alternative embodiment of FIG. 6B, two capacitive plates 53, 53' are stacked, such that in use capacitor plate 53 faces downwardly (ie. toward the wire being detected) whilst plate 53' faces upwardly. Driven guards are provided for each capacitor plate, the guard for plate 53' comprising a ring trace 82' surrounding capacitor plate 53', as well as a rectangular guard plate (not visible in FIG. 6B) on the underside of PCB 84'. As will be understood by the skilled reader, the driven guards 82, 82' are actively kept at the same voltage as the capacitor plates 53, 53', so there can be no current between plate and guard. Hence each plate 53, 53' is shielded against leakage currents and only senses electric fields from one direction. In this way capacitor plate 53' senses ambient electric fields, whilst plate 53 also detects the electric field of the wire. As explained above, differencing the derived signals assists in reducing the effect of ambient fields. In the embodiment of FIG. 6B, processor board 87 is mounted between the two PCBs 84, 84' the two structurally connected by way of fastening screws 86. It will be understood that processor 87 may perform signal processing (ie. fulfil part or all of the function of DPU 60) as well as the difference calculations. Processor output 88 again enables electrical connection from sensor 52 to monitor unit 56.

The apertures shown in PCBs 84, 84' are to accommodate detector shaft 54.

The circuitry of the device may include a filtering circuit to filter out the harmonics of the signal passed from processor 87 to the operator interface, in order to minimise potential feedback interference with the sensed signal.

It will be understood that the invention disclosed and defined in this specification extends to all alternative combinations of two or more of the individual features mentioned or evident from the text or drawings. All of these different combinations constitute various alternative aspects of the invention.

As used herein, except where the context requires otherwise, the term 'comprise' and variations of the term, such as 'comprising', 'comprises' and 'comprised', are not intended to exclude further additives, components, integers or steps.

The invention claimed is:

1. A system for locating a fault in a conductor composed of a first conductor portion and a second conductor portion separated from each other by the fault, the system including:
    a field generator, having:
        a first connection connectable to the first conductor portion;
        a first signal generator configured to apply a first oscillating signal between the first connection and an earth, the first oscillating signal having a frequency of between 1 and 20 kHz;
        a second connection connectable to the second conductor portion;
        a second signal generator configured to apply a second oscillating signal between the second connection and an earth, the second oscillating signal having a frequency of between 1 and 20 kHz and being different to the first oscillating signal, and
    a mobile detector configured to detect an electric field produced by the application of the first oscillating signal to the first conductor portion and an electric field produced by the application of the second oscillating signal to the second conductor portion, the detector including:
        a capacitive sensor element;
        a signal processor to which the sensor element is connected and having an output; and
        a monitor receiving the output from the signal processor and providing a signal to an operator to indicate the position of the fault,
    wherein the output from the signal processor provides a comparison to the operator between the electric field produced by the application of the first oscillating signal to the first conductor portion and the electric field produced from the application of the second oscillating signal to the second conductor portion.

2. The system of claim 1, wherein the capacitive sensor element is a capacitor plate.

3. The system of claim 2, wherein the capacitor plate is shielded to sense electric fields emanating primarily from one side of the plate only.

4. The system of claim 1, wherein the detector includes a further capacitive sensor element, the two capacitive sensor elements being configured to detect, respectively, the electric fields produced by the application of the first and the second oscillating signals to the respective conductor portions.

5. The system of claim 1, wherein the oscillating signals applied to the first and the second conductor portions are pseudorandom signals, and the signal processor includes an A/D converter and an analysis module able to discriminate between the two resulting electric fields.

6. The system of claim 5, wherein the pseudorandom signals are binary sequences, such as MLS sequences.

7. The system of claim 1, wherein the first and second oscillating signals are equal but opposite signals.

8. The system of claim 1, the monitor including a visual output and an audio output to the operator to assist in following one or both conductor portions and in locating the position of the fault.

9. The system of claim 1, wherein the detector includes a second, reference capacitive sensor element, the system arranged to allow differencing of the outputs of the capacitive sensor element and the second, reference capacitive sensor element.

10. The system of claim 9, wherein the capacitive sensor element and the second, reference capacitive sensor element are shielded to provide directional detection of electric fields.

11. The system of claim 10, wherein the capacitive sensor element and the second, reference capacitive sensor element are provided in the detector in a stacked, reversed arrangement to respectively detect fields coming from mutually opposed directions.

12. The system of claim 6, wherein the first and second oscillating signals are equal but opposite signals.

13. The system of claim 12, wherein opposite binary sequences are applied to each conductor portion to provide an abrupt discontinuity on a detected impulse response as the sensor element approaches and passes the fault.

14. A method for locating a fault in a conductor composed of a first conductor portion and a second conductor portion separated from each other by the fault, the method including:

using a field generator to apply a first oscillating signal between the first conductor portion and an earth, the first oscillating signal having a frequency of between 1 and 20 kHz;

using the field generator to apply a second oscillating signal between the second conductor portion and an earth, the second oscillating signal having a frequency of between 1 and 20 kHz and being different to the first oscillating signal;

using a mobile detector to capacitively detect a first electric field produced by the application of the first oscillating signal and to output a signal representing the detected first electric field;

using the mobile detector to capacitively detect a second electric field produced by the application of the second oscillating signal and generate a signal representing the detected second electric field;

maneuvering the mobile detector to locate the position of the fault by reference to the signals generated by detection of both first and second electric fields; and     providing a signal representing a comparison between the signal representing the detected first electric field and the signal representing the detected second electric field.

\* \* \* \* \*